United States Patent
Sun et al.

(10) Patent No.: US 12,048,202 B2
(45) Date of Patent: Jul. 23, 2024

(54) ARRAY SUBSTRATE INCLUDING PIXEL DEFINING LAYER WITH SPACER PARTS

(71) Applicant: BOE Technology Group Co., Ltd., Beijing (CN)

(72) Inventors: Hongda Sun, Beijing (CN); Youngsuk Song, Beijing (CN); Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/874,653

(22) Filed: Jul. 27, 2022

(65) Prior Publication Data

US 2023/0042951 A1 Feb. 9, 2023

Related U.S. Application Data

(63) Continuation of application No. 16/082,396, filed as application No. PCT/CN2018/079445 on Mar. 19, 2018, now Pat. No. 11,424,303.

(30) Foreign Application Priority Data

Oct. 13, 2017 (CN) .......................... 201710954861.7

(51) Int. Cl.
*H10K 59/12* (2023.01)
*H10K 50/84* (2023.01)
(Continued)

(52) U.S. Cl.
CPC ....... *H10K 59/122* (2023.02); *H10K 50/8428* (2023.02); *H10K 50/844* (2023.02);
(Continued)

(58) Field of Classification Search
CPC .. H10K 50/8428; H10K 50/844; H10K 50/14; H10K 50/15; H10K 50/16;
(Continued)

(56) References Cited

U.S. PATENT DOCUMENTS 6,222,180 B1   4/2001   Ormond et al.
7,199,516 B2   4/2007   Seo et al.
(Continued)

FOREIGN PATENT DOCUMENTS

CN   102324432 A   1/2012
CN   103915467 A   7/2014
(Continued)

OTHER PUBLICATIONS

International Search Report dated Jun. 28, 2018, issued in counterpart International Application No. PCT/CN2018/079445. (10 pages).
(Continued)

*Primary Examiner* — Ida M Soward
(74) *Attorney, Agent, or Firm* — WHDA, LLP

(57) ABSTRACT

An array substrate includes a base substrate and a pixel defining layer on the base substrate. The pixel defining layer includes a plurality of thickness thinning regions. The thickness thinning regions have a smaller height than other areas of the pixel define layer on the base substrate. The plurality of the thickness thinning regions is configured to guide flow of fillers to form an encapsulating layer on the pixel defining layer.

17 Claims, 6 Drawing Sheets

(51) Int. Cl.
| | |
|---|---|
| *H10K 50/842* | (2023.01) |
| *H10K 50/844* | (2023.01) |
| *H10K 59/122* | (2023.01) |
| *H10K 59/17* | (2023.01) |
| *H10K 59/173* | (2023.01) |
| *G02F 1/1335* | (2006.01) |
| *G02F 1/1339* | (2006.01) |
| *G02F 1/1362* | (2006.01) |
| *H01L 27/15* | (2006.01) |
| *H10K 30/82* | (2023.01) |
| *H10K 50/14* | (2023.01) |
| *H10K 50/15* | (2023.01) |
| *H10K 50/16* | (2023.01) |
| *H10K 50/824* | (2023.01) |
| *H10K 59/121* | (2023.01) |
| *H10K 59/18* | (2023.01) |

(52) U.S. Cl.
CPC ..... *H10K 59/173* (2023.02); *G02F 1/133512* (2013.01); *G02F 1/133514* (2013.01); *G02F 1/13394* (2013.01); *G02F 1/136209* (2013.01); *H01L 27/156* (2013.01); *H10K 30/82* (2023.02); *H10K 50/14* (2023.02); *H10K 50/15* (2023.02); *H10K 50/16* (2023.02); *H10K 50/824* (2023.02); *H10K 50/8426* (2023.02); *H10K 59/12* (2023.02); *H10K 59/121* (2023.02); *H10K 59/18* (2023.02)

(58) Field of Classification Search
CPC .. H10K 50/824; H10K 50/8426; H10K 50/84; H10K 50/841; H10K 59/122; H10K 59/173; H10K 59/12; H10K 59/121; H10K 59/18; H10K 2102/351; H10K 30/82; G02F 1/133512; G02F 1/13394; G02F 1/136209; G02F 1/133514
See application file for complete search history.

(56) References Cited

U.S. PATENT DOCUMENTS

| | | | | |
|---|---|---|---|---|
| 7,633,218 | B2 * | 12/2009 | Cok | H10K 59/32 |
| | | | | 313/506 |
| 7,714,499 | B2 * | 5/2010 | Park | H10K 59/173 |
| | | | | 313/506 |
| 8,148,893 | B2 * | 4/2012 | Tomita | H10K 59/122 |
| | | | | 445/24 |
| 8,274,219 | B2 | 9/2012 | Wu | |
| 8,368,056 | B2 * | 2/2013 | Lee | H10K 50/841 |
| | | | | 313/503 |
| 8,680,513 | B2 | 3/2014 | Jung et al. | |
| 9,087,998 | B2 | 7/2015 | Jang et al. | |
| 9,231,036 | B2 | 1/2016 | Oooka et al. | |
| 9,269,922 | B2 | 2/2016 | Matsumoto et al. | |
| 9,614,015 | B2 | 4/2017 | Park et al. | |
| 9,882,131 | B2 * | 1/2018 | Koo | H10K 59/122 |
| 9,911,795 | B2 | 3/2018 | Hou et al. | |
| 10,205,121 | B2 | 2/2019 | Song et al. | |
| 10,446,622 | B2 | 10/2019 | Wang et al. | |
| 10,566,578 | B2 | 2/2020 | Sakamoto et al. | |
| 2004/0021413 | A1 * | 2/2004 | Ito | H10K 59/122 |
| | | | | 313/504 |
| 2004/0119066 | A1 | 6/2004 | Han et al. | |
| 2006/0035469 | A1 * | 2/2006 | Truong | H10K 59/122 |
| | | | | 438/739 |
| 2006/0097263 | A1 | 5/2006 | Lee et al. | |
| 2008/0026303 | A1 | 1/2008 | Tsukamoto et al. | |
| 2009/0026467 | A1 | 1/2009 | Yanagihara | |
| 2009/0160322 | A1 | 6/2009 | Yoshida et al. | |
| 2010/0171105 | A1 | 7/2010 | Kim et al. | |
| 2010/0213449 | A1 | 8/2010 | Yamamoto et al. | |
| 2013/0234126 | A1 | 9/2013 | Nakatani | |
| 2013/0234590 | A1 * | 9/2013 | Li | H05B 33/24 |
| | | | | 445/24 |
| 2014/0183458 | A1 | 7/2014 | Lee et al. | |
| 2014/0191219 | A1 | 7/2014 | Kim | |
| 2014/0239265 | A1 | 8/2014 | Kim | |
| 2014/0284572 | A1 * | 9/2014 | Oooka | H10K 59/123 |
| | | | | 257/40 |
| 2015/0069361 | A1 | 3/2015 | Sato et al. | |
| 2015/0188082 | A1 | 7/2015 | Rohatgi | |
| 2016/0118631 | A1 | 4/2016 | Kim et al. | |
| 2016/0351637 | A1 | 12/2016 | Hashimoto et al. | |
| 2017/0012246 | A1 | 1/2017 | Onimaru et al. | |
| 2017/0040393 | A1 * | 2/2017 | Onimaru | H10K 50/11 |
| 2017/0069696 | A1 | 3/2017 | Kondo | |
| 2017/0117339 | A1 | 4/2017 | Takata | |
| 2017/0133357 | A1 * | 5/2017 | Kuo | H01L 25/167 |
| 2017/0170245 | A1 | 6/2017 | Lin | |
| 2017/0194595 | A1 | 7/2017 | Li et al. | |
| 2017/0213881 | A1 | 7/2017 | Kondo | |
| 2017/0250367 | A1 | 8/2017 | Yasukawa | |
| 2018/0342563 | A1 | 11/2018 | You et al. | |

FOREIGN PATENT DOCUMENTS

| | | | | |
|---|---|---|---|---|
| CN | 104409647 | A | 3/2015 | |
| CN | 105470409 | A | 4/2016 | |
| CN | 105762172 | A | 7/2016 | |
| CN | 107104127 | A | 8/2017 | |
| CN | 107104130 | A | 8/2017 | |
| EP | 2151868 | A1 | 2/2010 | |
| JP | 2003-229247 | A | 8/2003 | |
| JP | 2010-161058 | A | 7/2010 | |
| JP | 2010-287421 | A | 12/2010 | |
| JP | 2011-181305 | A | 9/2011 | |
| JP | 2015-138180 | A | 7/2015 | |
| JP | 2015-207526 | A | 11/2015 | |
| JP | 2017-054601 | A | 3/2017 | |
| JP | 2017-134898 | A | 8/2017 | |
| JP | 2017-151315 | A | 8/2017 | |
| KR | 10-2007-0050685 | A | 5/2007 | |
| KR | 20100081774 | A * | 7/2010 | ......... H10K 50/8426 |
| KR | 20110005593 | A * | 1/2011 | ............ H10K 50/84 |
| WO | 2008/146470 | A1 | 12/2008 | |
| WO | 2015/125448 | A1 | 8/2015 | |
| WO | 2015/155971 | A1 | 10/2015 | |

OTHER PUBLICATIONS

Office Action dated Apr. 28, 2020, issued in counterpart JP application No. 201710954861.7, with English translation. (15 pages).
Office Action dated Sep. 28, 2020, issued in counterpart to CN Application No. 201710954861.7, with English translation (17 pages).
The Extended European Search report dated Jun. 17, 2021, issued in counterpart Ep Application No. 18780012.3. (8 pages).
Office Action dated Jul. 27, 2021, issued in counterpart JP application No. 2018-566950, with English translation. (14 pages).
Office Action dated Dec. 4, 2020, issued in counterpart IN application No. 201847041098, with English translation (5 pages).

* cited by examiner

ARRAY SUBSTRATE INCLUDING PIXEL DEFINING LAYER WITH SPACER PARTS

CROSS-REFERENCE TO RELATED APPLICATIONS

This is a continuation of U.S. application Ser. No. 16/082,396 filed on Sep. 5, 2018, which claims benefit of the filing date of Chinese Patent Application No. 201710954861.7 filed on Oct. 13, 2017, the disclosure of which is hereby incorporated by reference.

TECHNICAL FIELD

This invention relates to display technology, and more particularly, to an array substrate, a display panel, a display apparatus, and a fabricating method thereof.

BACKGROUND

An Organic Light-Emitting Diode (OLED) display device comprises an anode, an organic layer, and a cathode. The organic layer includes a hole transport layer, an electron transport layer, and an organic light-emitting layer located between the hole transport layer and the electron transport layer. Compared with an Liquid-Crystal Display (LCD) device, the OLED display device has advantages such as thin, light, wide visual angle, actively emitting light, continuous and adjustable color of emitting light, low cost, high response speed, low energy consumption, low driving voltage, wide working temperature range, simple production process, high light emitting efficiency, and capable of being flexibly displayed and the like. Because of these incomparable advantages and good application prospect compared to other displays, the OLED display has obtained great attention from industry and the scientific community.

BRIEF SUMMARY

Accordingly, one example of the present disclosure is an array substrate. The array substrate may include a base substrate and a pixel defining layer on the base substrate. The pixel defining layer may comprise a plurality of thickness thinning regions. The thickness thinning regions may have a smaller height than other areas of the pixel defining layer on the base substrate, and the plurality of the thickness thinning regions may be configured to guide flow of fillers to form an encapsulating layer on the pixel defining layer.

The pixel defining layer may comprise a plurality of first spacing parts and a plurality of second spacing parts intersecting the plurality of the first spacing parts. Each of the plurality of the second spacing parts may include a plurality of second spacing sub-parts. A height of each of the plurality of the second spacing sub-parts may be smaller than that of each of the plurality of the first spacing parts. Each of the thickness thinning regions may comprise a plurality of the second spacing sub-parts between two adjacent first spacing parts. Each of the plurality of the first spacing parts may have a rectangular strip shape. A length direction of the first spacing parts may be a first direction. The plurality of the first spacing parts may be distributed at intervals in a second direction. One of the first direction and the second direction may be a length direction of the base substrate, and the other may be a width direction of the base substrate.

The pixel defining layer may define a plurality of pixel grids arranged in an array, and at least some of the pixel grids may be located between two adjacent second spacing parts. Each of the pixel grids may have two pairs of opposite sides. One pair of the opposite sides may be respectively in contact with two adjacent first spacing parts, and the other pair of the opposite sides may be respectively in contact with two adjacent second spacing sub-parts. In one embodiment, a surface of each of the plurality of the first spacing parts is an arc-shaped surface. In another embodiment, a surface of each of the plurality of the first spacing parts is a flat surface. A surface of each of the plurality of the second spacing sub-parts may be an arc-shaped surface or a flat surface.

Heights of the plurality of the second spacing sub-parts in a same thickness thinning region may gradually decrease or increase along the first direction. In one embodiment, a distance between any two adjacent second spacing sub-parts in a same thickness thinning region may gradually increase or decrease along the first direction. In another embodiment, a distance between any two adjacent second spacing sub-parts in a same thickness thinning region is the same along the first direction. A thickness of each of the plurality of the second spacing parts may be larger than or equal to 2 micrometers.

Another example of the present disclosure is a display panel. The Display panel may include an array substrate according to one embodiment of the present disclosure. The display panel may further include a cover plate stacked above the array substrate. The encapsulating layer may be arranged between the cover plate and the array substrate. Spacers may be arranged on one side of the cover plate facing the array substrate, and orthographic projection of the spacers on the array substrate may not overlap the thickness thinning regions. The display panel may be an OLED display panel.

Another example of the present disclosure is a method of fabricating a display panel. The method of fabricating a display panel may include forming a pixel defining layer on a base substrate. The pixel defining layer may define a plurality of pixel grids arranged in an array mode. The pixel defining layer may further include a plurality of thickness thinning regions. The thickness thinning regions may have a smaller height than other areas of the pixel defining layer. The thickness thinning regions may be configured to guide flow of fillers to form an encapsulating layer on the pixel defining layer. The pixel defining layer may be formed by masking and exposure.

Another example of the present disclosure is a display apparatus. The display apparatus may include an array substrate according to one embodiment of the present disclosure.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
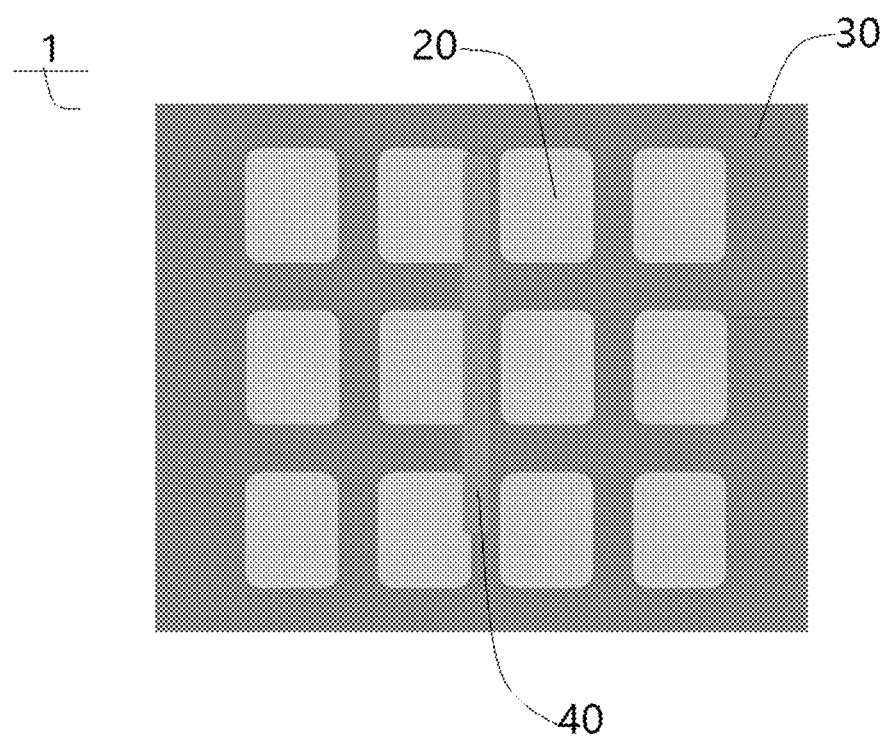
FIG. 1 is a partial schematic diagram of an array substrate according to an embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-5. When referring to the figures, like structures and elements shown throughout are indicated with like reference numerals.

In the description of the disclosures, the terms "length," "width," "thickness," "upper," "lower," and "inner," which indicate orientation or positional relation, are based on the orientation or positional relation shown in the figures. They are only for facilitating describing the present disclosure and simplifying the description. They do not indicate or imply the indicated device or element must have a specific orientation or be constructed and operated in a specific orientation. Therefore, they cannot be construed as a limitation on the present disclosure. In addition, a "first" or a "second" feature can be explicitly or implicitly include one or more features. In the description of the present disclosure, unless otherwise indicated, "a plurality" means two or more than two.

In the description of the present disclosure, unless stated otherwise, the terms "installing," "connected" and "connection" should be construed broadly. For example, they can be construed as fixedly connected or detachably connected or integrally connected. They can be mechanically connected or electrically connected and can be directly connected or indirectly connected through an intermediate medium. There can also be an internal connection between two elements. A person of ordinary skill in the art would understand the specific meaning of the terms in the disclosure in specific situations.

Water vapor, oxygen and other components in the air have a great impact on the service life of OLEDs. The main reasons are as follows: during operation of the OLED, electrons need to be injected from the cathode. This requires the work function of the cathode to be as low as possible. Examples of the cathode material are aluminum, magnesium, calcium and other metal materials. However, these metal materials are all relatively active and easily react with penetrating water vapor. In addition, water vapor can chemically react with the hole transport layer and the electron transport layer so that the OLED can fail. Therefore, effective encapsulation of the OLED, so that functional layers of the device are isolated from water vapor, oxygen and other components in the atmosphere, can greatly extend service life of the device.

In the prior art, for a top-emitting OLED device, during the encapsulating process, fluidity of fillers for the filling encapsulating layer is usually low, thereby causing fillers for the filling encapsulating layer to be excessively filled or insufficiently filled. As a result, part of the device may not be sufficiently filled with fillers for the encapsulating layer, and accordingly bubbles are generated. Alternatively, part of the device is excessively filled with fillers for the encapsulating layer, and accordingly the auxiliary cathode fails. In some cases, the two problems occur in a same product.

An array substrate 1 is described according to embodiments of the present disclosure with reference to FIGS. 1-4 as below.

In one embodiment, as shown in FIGS. 1-4, the array substrate 1 includes a base substrate 10 and a pixel defining layer 30.

Specifically, as shown in FIGS. 1-4, the pixel defining layer 30 is arranged on the base substrate 10. The pixel defining layer 30 defines a plurality of pixels 20 arranged in an array. The pixel defining layer 30 may have through holes 25. The pixels 20 may be located in the through holes 25 respectively. The thickness at different areas of the pixel defining layer 30 may be inconsistent. The pixel defining layer 30 further comprises a plurality of thickness thinning regions (or first regions) 312. The thickness thinning region 312 is suitable for guiding fillers for an encapsulating layer to flow. A pixel defining layer 30 can be laid on a surface of one side of the base substrate 10. The pixel defining layer 30 may include a plurality of thickness thinning regions 312. The thicknesses or heights of the areas defined by the thickness thinning regions 312 on the array substrate 1 are smaller than those of the other areas of the array substrate 1. The "thickness" or "height" of the pixel defining layer as used herein is measured from the surface of the base substrate facing the pixel defining layer.

An array substrate 1 is provided according to one embodiment of the present disclosure. A pixel definition layer 30 is laid on the substrate 10. A plurality of pixel grids 20 is defined by the pixel defining layer 30. The pixel defining layer 30 further comprises a plurality of thickness thinning regions 312. When the encapsulating layer 40 is filled to the array substrate 1, the thickness thinning regions 312 can guide flow direction of fillers for the encapsulating layer 40 so that fillers for the encapsulating layer 40 can be more uniformly filled, thereby preventing situations in which fillers for the encapsulating layer 40 are excessively filled or not fully filled, which cause poor performance of an OLED or other devices on the array substrate.

Figure 2A:
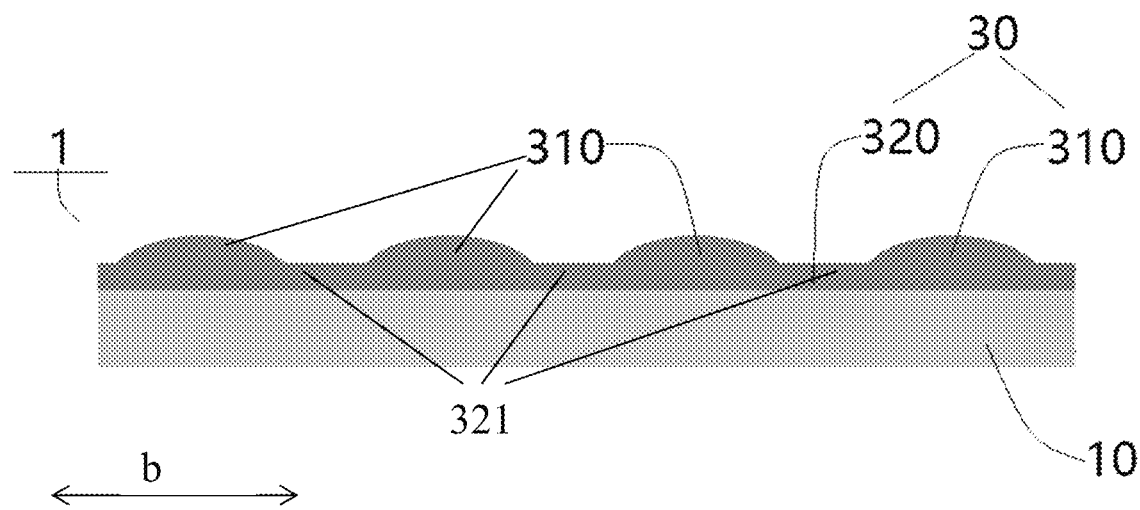
FIG. 2A is a partial schematic cross-sectional view of an array substrate along line B-B' in FIG. 3 according to an embodiment of the present disclosure.
Figure 4:
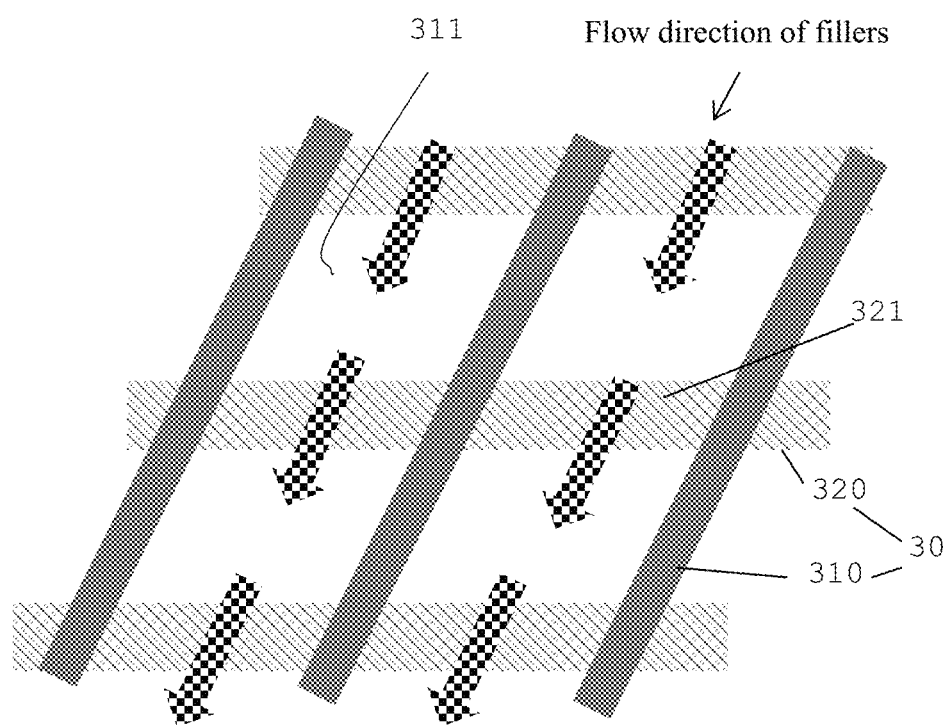
FIG. 4 is a schematic diagram of encapsulating an array substrate using fillers for an encapsulating layer according to one embodiment of the present disclosure.

In one embodiment, as shown in FIGS. 2 and 4, the pixel defining layer 30 includes a plurality of first spacing parts 310 and a plurality of second spacing parts 320 intersecting the plurality of the first spacing parts. That is, the first spacing parts 310 are arranged along direction a and the second spacing parts 320 are arranged along direction b. Direction a and direction b are perpendicular to each other. The portion of the second spacing part between two adjacent first spacing parts is termed as a second spacing sub-part 321. Each of the second spacing parts 320 includes a plurality of second spacing sub-parts 321 along direction b. The plurality of first spacing parts 310 defines a plurality of arrangement regions 311. The arrangement region 311 is defined by any of two adjacent first spacing parts 310. The second spacing sub-parts 321 form thickness thinning regions 312. At least one of the plurality of the arrangement regions 311 includes a plurality of second spacing sub-parts 321 and a plurality of pixels along direction a. The plurality of first spacing parts 310 may be distributed at intervals. The plurality of the second spacing parts 320 form thickness thinning regions 312 of the array substrate 1. That is, a thickness thinning region may include a plurality of second spacing sub-parts 321 along direction a. In one embodiment, the pixels 20 may be located between every two adjacent second spacing sub-parts 321. In another embodiment, some of the pixels 20 may be located between two adjacent second spacing sub-parts 321. Therefore, the positions of the pixels 20 can be defined by the plurality of the first spacing parts 310 and the second spacing sub-parts 321.

In one embodiment, the height of the second spacing part 320 is smaller than the height of the first spacing part 310. That is, the distance between the side of the second spacing part 320 away from the base substrate 10 and the base substrate 10 is smaller than the distance between the side of the first spacing part 310 away from the base substrate 10 and the base substrate 10. As such, fillers for the encapsulating layer 40 can flow along the thickness thinning regions 312 defined by the first spacing parts 310.

In one embodiment as shown in FIG. 2, the surface of a free end of the first spacing part 310 may have an arc-shaped surface. That is, the surface of one side of the first spacing part 310 away from the base substrate 10 may be formed as an arc-shaped surface. As such, fillers for the encapsulating layer 40 can smoothly flow through the arc-shaped surface, thereby facilitating fillers for the encapsulating layer 40 being fully filled in the whole area needed to be filled. Further, the arc-shaped surface protrudes in a direction away from the base substrate 10. In other words, along a width direction of the first spacing part 310, from the middle to the two sides of the arc-shaped surface, the distance between the arc-shaped surface and the base substrate 10 is gradually reduced. If the first spacing part 310 is cut in a direction perpendicular to the extension direction of the first spacing part 310, the shape of the cross section of the first spacing part 310 at any position may be the same.

In another embodiment, the surface of the free end of the first spacing part 310 may be a plane or a flat surface. That is, the surface of the side of the first spacing part 310 away from the base substrate 10 is formed as a plane or a flat surface. In other words, the distance between any position on the surface of the first spacing part 310 away from the base substrate 10 to the base substrate 10 is equal. Resistance of a plane to a fluid is small, so fillers for the encapsulating layer 40 can quickly flow on the plane, thereby increasing filling rate. Meanwhile, a transition from the first spacing part 310 to the base substrate 10 is not smooth, thereby facilitating fillers for the encapsulating layer 40 being filled into designated areas.

In one embodiment of the present disclosure, a surface of a free end of the second spacing part 320 may be an arc surface or a plane. As shown in FIG. 2, the surface of the side of the second spacing part 320 away from the base substrate 10 may be formed as a plane or a flat surface, thereby facilitating fillers for the encapsulating layer 40 being filled into designated areas. The surface of the second spacing part 320 away from the side of the base substrate 10 may also be formed as an arc-shaped surface. As such, fillers for the encapsulating layer 40 can smoothly flow through the arc-shaped surface, thereby facilitating the fillers for the encapsulating layer 40 being filled into the whole area needed to be filled.

Figure 2B:
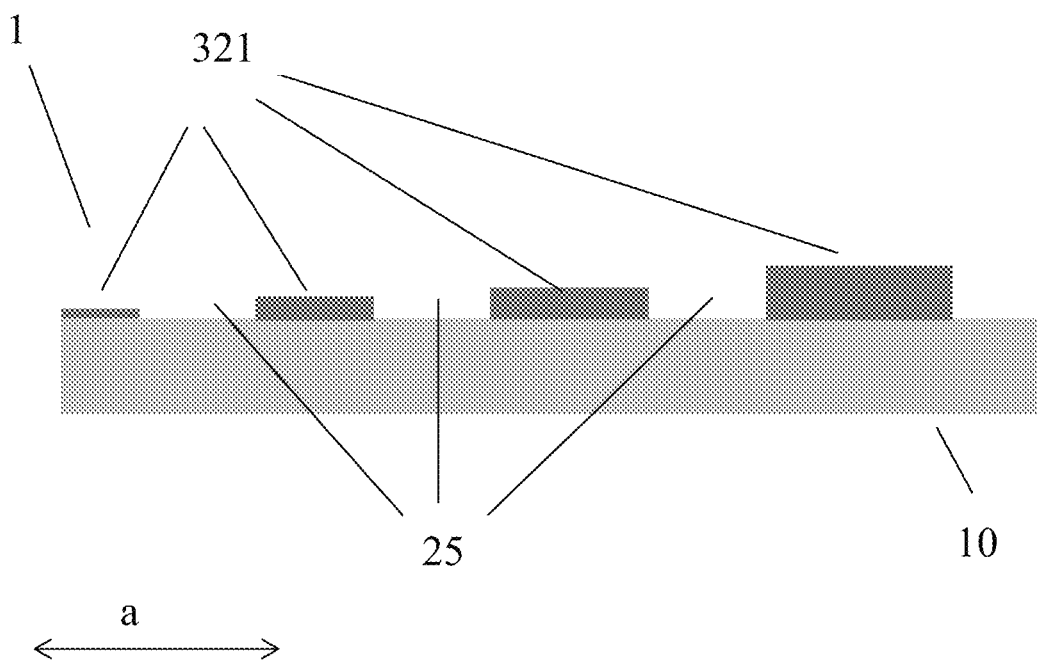
FIG. 2B is a partial schematic cross-sectional view of an array substrate along line A-A' in FIG. 3 according to an embodiment of the present disclosure.
Figure 3:
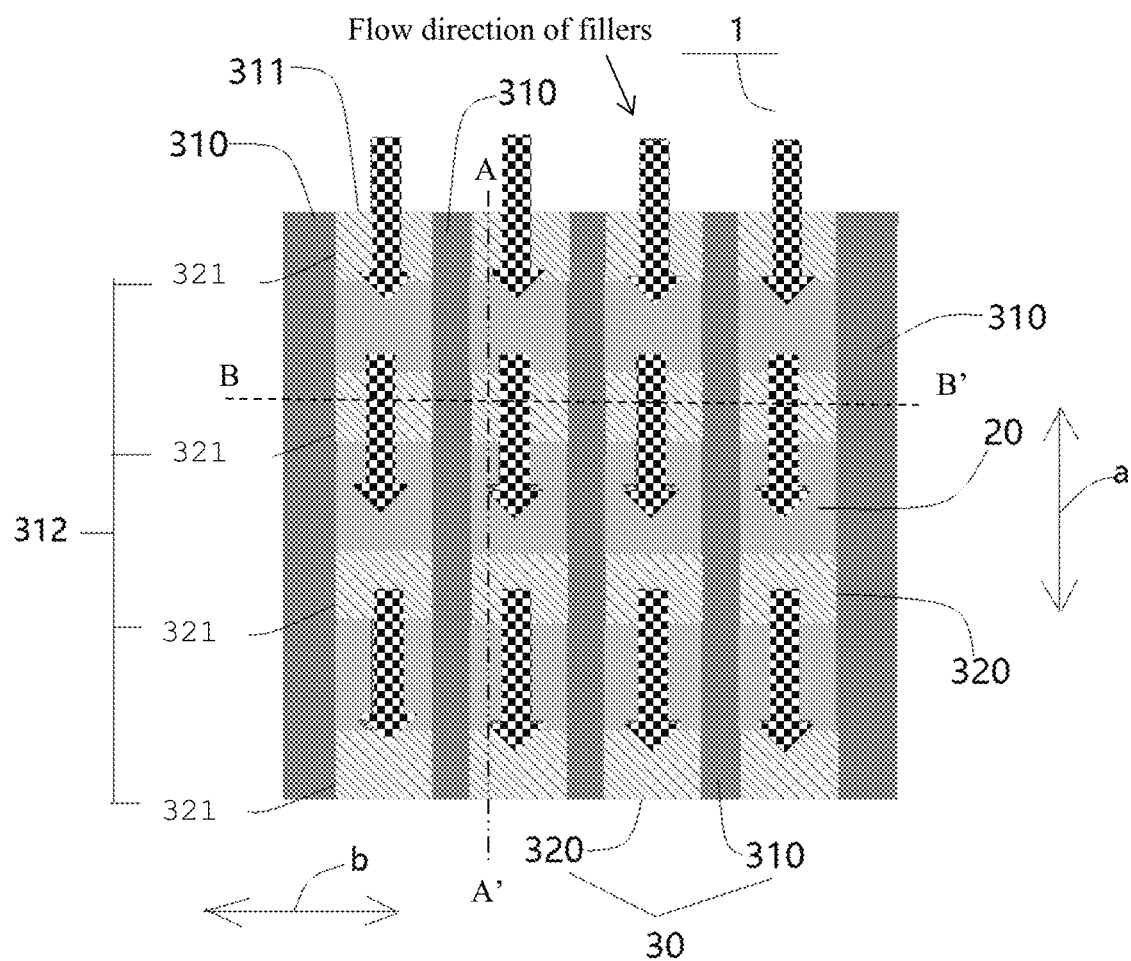
FIG. 3 is a schematic diagram of encapsulating an array substrate using fillers for an encapsulating layer according to an embodiment of the present invention.

In one embodiment as shown in FIGS. 2 to 4, the first spacing part 310 is a rectangular strip. A length direction of the first spacing part 310 is a first direction a. A plurality of the first spacing parts 310 is distributed in parallel at intervals along a second direction b. One of the first direction a and the second direction b is the length direction of the substrate 10 and the other is the width direction of the base substrate 10. In one embodiment, the plurality of first spacing parts 310 can be arranged in parallel at intervals along the width direction of the substrate 10. Any one of the first spacing parts 310 may be rectangular. The length direction of the rectangle may extend along the length direction of the base substrate 10. In another embodiment, the plurality of the first spacing parts 310 may be arranged in parallel at intervals along the length direction of the base substrate 10. Any one of the first spacing parts 310 may be rectangular. The length direction of the rectangle may extend along the width direction of the base substrate 10. As such, fillers for the encapsulating layer 40 can be guided to flow along straight lines.

In one embodiment, along the second direction b, the distance between the two adjacent first spacing parts 310 may be gradually changed, for example, increased or decreased. That is, from one end to the other end of the array substrate along the second direction b, the distance between every two adjacent first spacing parts 310 can be gradually increased or gradually decreased. As such, first spacing parts 310 can be arranged according to an arrangement of the pixel grids.

In one embodiment, as shown in FIGS. 1-4, the distance between any two adjacent first spacing parts 310 may be equal. A plurality of first spacing parts 310 are uniformly distributed on the substrate 10 at intervals, thereby facilitating uniform arrangement of the pixel grids.

In one embodiment, as shown in FIGS. 2-4, a plurality of the second spacing parts 320 located in the same arrangement region 311 are distributed at intervals along the first direction a. In the same arrangement region 311, the plurality of the second spacing parts 320 form a plurality of rows. Among the plurality of second spacing parts 320, there are intervals between every two adjacent second spacing parts 320. As such, the plurality of second spacing parts 320 can guide the encapsulating layer 40 to flow along a straight line.

In one embodiment, among the plurality of second spacing parts 320 located in the same arrangement region 311, in the first direction a, the distance between the two adjacent second spacing parts 320 is gradually increased. As shown in FIG. 2B, from one end to the other end of the base substrate along the first direction a, the distance between every two adjacent second spacing parts 320 can be gradually increased or gradually decreased. As such, the arrangement mode of the pixel grids can be increased.

In one embodiment, among the plurality of the second spacing parts 320 located in the same arrangement region 311, in the first direction a, the height of the plurality of the second spacing parts 320 is gradually decreased, as shown in FIG. 2B. From one end to the other end of the base substrate along the first direction a, the heights of the second spacing parts 320 are gradually decreased or gradually increased. Fillers for the encapsulating layer 40 are adapted to flow from one end to the other end of the base substrate along the first direction a. In a flow direction of the encapsulating layer 40, for any two adjacent second spacing parts 320, the height of the second spacing part 320 located downstream is lower than the height of the second spacing part 320 located upstream. As such, fillers for the encapsulating layer 40 can be better guided to flow from one side of the base substrate 10 to the other side of the base substrate 10 along the first direction a. In one embodiment, among the plurality of second spacing parts 320 located in the same arrangement region 311, in the first direction a, the height of the second spacing parts 320 is distributed in a stepped mode.

In one embodiment, as shown in FIGS. 2-4, among a plurality of the second spacing parts 320 located in the same arrangement region 311, the distance between any two of the adjacent second spacing parts 320 is equal. The plurality of the second spacing parts 320 is uniformly distributed in the arrangement region 311, thereby, improving uniformity of the pixel defining layer and facilitating arrangement uniformity of the pixel grids.

In one embodiment, as shown in FIG. 2 and FIG. 4, the base substrate 10 may be a rectangular flat plate. The first spacing part 310 may be in a strip shape. The plurality of first spacing part parts 310 may extend along the length direction (or width direction) of the base substrate 10 and may be arranged in parallel at equal intervals. The length extension direction of any of the first spacing parts 310 may be the same as the width direction (or length direction) of the base substrate 10 so that a plurality of strip-shaped arrangement regions 311 can be defined on the base substrate 10.

Further, in one embodiment as shown in FIG. 2 and FIG. 4, the plurality of second spacing parts 320 may be in a strip shape. The length extension direction of the second spacing part 320 may be perpendicular to the length extension direction of the arrangement region 311. The plurality of the second spacing parts 320 may be distributed at equal intervals on the arrangement region 311. The pixel grids 20 may be located in the intervals of either of the two second spacing parts 320. As shown in FIG. 2 and FIG. 4, the pixel grid 20 may be rectangular. The pixel grid 20 has two pairs of opposite sides. One pair of opposite sides may be respectively in contact with two adjacent first spacing parts 310. The other pair of opposite sides may be respectively in contact with two adjacent second spacing parts 320. In one embodiment, the thickness of the pixel defining layer 30 may be greater than or equal to 2 micrometers. The thicknesses of the first spacing part 310 and the second spacing part 320 are greater than or equal to 2 micrometers. As such, light emitting elements above the pixel defining layer 30 can be prevented from contacting the anode below the pixel defining layer 30.

A display panel is provided according to one embodiment of the present disclosure. The display panel includes an array substrate and a cover plate. The array substrate may be any one of the array substrates 1 according to one embodiment of the present disclosure.

Figure 5:
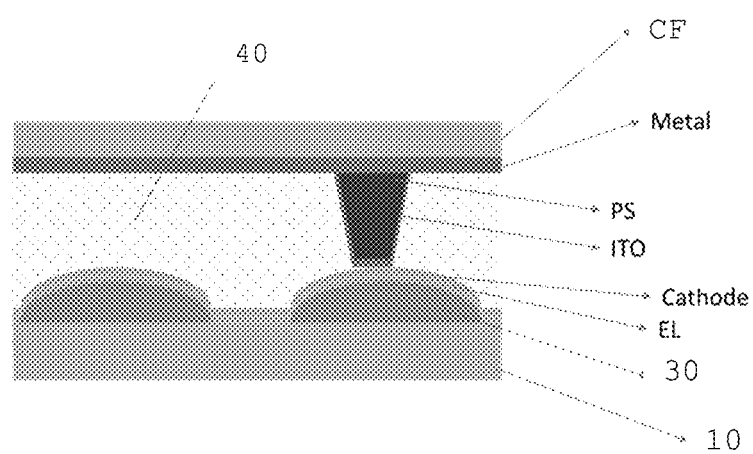
FIG. 5 is a schematic diagram of a display panel according to one embodiment of the present disclosure.
Figure 6:
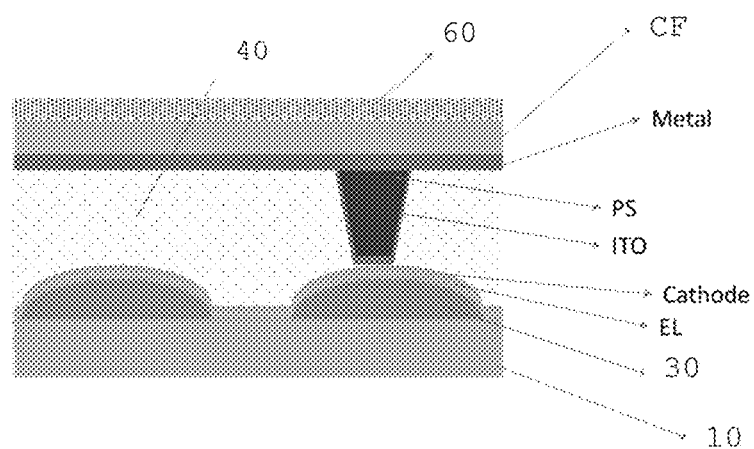
FIG. 6 is a schematic diagram of a display panel according to one embodiment of the present disclosure.

In one embodiment, as shown in FIG. 5 and FIG. 6, the cover plate 60 is stacked on the base substrate 10. An encapsulating layer 40 may be arranged between the cover plate 60 and the array substrate 1. The side of the substrate 10 provided with a pixel defining layer 30 is opposite to the cover plate 60. The encapsulating layer 40 can be arranged between the array substrate 1 and the cover plate 60 so that the array substrate 1 is isolated from the cover plate 60. Fillers for the encapsulating layer 40 can have fluidity. Fillers for the encapsulating layer 40 can flow to any gap between the array substrate 1 and the cover plate 60. The encapsulating layer 40 may have adhesion capability so that the array substrate 1 and the cover plate 60 can be packaged together.

In one embodiment of the display panel, the pixel defining layer 30 is laid on the base substrate 10. A plurality of pixel grids 20 are defined by the pixel defining layer 30. The pixel defining layer 30 further comprises a plurality of thickness thinning regions 312. When fillers for the encapsulating layer 40 fill the array substrate 1, the thickness thinning regions 312 can guide the flow direction of the fillers for the encapsulating layer 40, so that fillers for the encapsulating layer 40 can be filled uniformly, thereby preventing fillers for the encapsulating layer 40 from being filled excessively or not fully, which causes invalid or poor performance of the display panel.

In one embodiment, as shown in FIG. 5, spacers may be disposed on a side of the cover plate facing the array substrate 1. Orthographic projections of the spacers on the array substrate 1 do not overlap the thickness thinning regions 312. In another embodiment, the spacers (PS pattern) are disposed toward the first spacing parts 310. The spacers (PS pattern) may be opposite to the first spacing parts 310. Further, the spacer (PS pattern) may be in a circular truncated cone shape. In one embodiment, a surface of a free end of the circular truncated cone may protrude towards the first spacing part 310. As such, a packaging height of the OLED can be easily realized.

In one embodiment, the display panel may be an OLED display panel. The OLED display panel has advantages such as thin, light, wide viewing angle, active light emitting, continuous and adjustable color of emitting light, low cost, fast response speed, low energy consumption, low driving voltage, wide working temperature range, simple production process, high light emitting efficiency, and flexible display and the like.

Another example of the present disclosure is a manufacturing method of the display panel. The manufacturing method includes the following steps. A color filter is formed on the base substrate 10. A pixel defining layer 30 is then formed on the base substrate 10. The pixel defining layer 30 defines a plurality of pixel grids 20 arranged in an array. The pixel defining layer 30 further comprises a plurality of thickness thinning regions 312. The thicknesses or heights of the thickness thinning regions 312 are smaller than those of other regions of the pixel defining layer 30. The thickness thinning regions 312 are suitable for guiding fillers for the encapsulating layer 40 to flow. A cover plate and the base substrate are arranged in a layered structure. Fillers for the encapsulating layer 40 are filled between the cover plate and the array substrate 1.

In the method of manufacturing the display panel according to the embodiment of present disclosure, a pixel defining layer 30 is laid on the substrate 10. A plurality of pixel grids 20 is defined by the pixel defining layer 30. The pixel defining layer 30 further comprises a plurality of thickness thinning regions 312. When fillers for the encapsulating layer 40 are filled into the array substrate 1, the thickness thinning regions 312 can guide flow direction of the fillers for the encapsulating layer 40 so that the fillers for the encapsulating layer 40 can be more uniformly filled, thereby preventing fillers for the encapsulating layer 40 from being filled excessively or not fully, which causes poor performance of the display panel such as an OLED display panel.

According to one embodiment of the present disclosure, the manufacturing method comprises the following steps: A color filter is formed on the base substrate. A pixel defining layer 30 is manufactured on the base substrate 10. As shown in FIG. 5, an electroluminescence (EL) and a cathode are manufactured on the pixel defining layer 30. Separately, a black matrix (BM) pattern, a color film (CF) graph, an optical adhesive (OC) graph, a metal graph, a PS graph and an ITO graph are manufactured on the cover plate. The base substrate 10 and the cover plate are then packaged. The ITO pattern on the PS pattern is connected with the cathode to form an auxiliary cathode. Then, fillers for an encapsulating layer 40 are filled between the base substrate 10 and the cover plate.

In one embodiment, a color filter is laid on the surface of the substrate 10. Then, a pixel defining layer 30 is laid on the color filter. The pixel defining layer 30 can define positions of the pixel grids 20. Then, an Electroluminescence (EL) and a cathode are formed on the pixel defining layer 30. Separately, a black matrix (BM) pattern and a color film (CF) pattern are manufactured on the cover plate. An Optical Adhesive (OC) pattern is laid on the BM pattern and the CF pattern for encapsulating. Then a metal pattern (metal layer) is manufactured on the surface of OC pattern. Then, a plurality of spacers (PS patterns) is arranged at intervals on the metal pattern (metal layer), and an Indium Tin Oxide (ITO) pattern is formed on the spacer (PS pattern) in a sleeved mode. Finally, the side of the base substrate 10 on which the cathode is formed may face the ITO pattern formed on the cover plate so that the cathode may be connected to the ITO. The encapsulating layer 40 is then filled in the interval between the array substrate 1 and the cover plate.

In one embodiment, the pixel defining layer 30 may be formed by masking and exposure. In other words, the first spacing part 310 and the second spacing part 320 can both be formed by masking and exposure. The masking is to mask a processed image by a selected image, pattern or object, partly or in whole, so as to control the area or process of the image processing, thereby improving manufacturing accuracy of the pixel defining layer 30.

A display apparatus is provided according to one embodiment of the present disclosure. The display apparatus comprises an array substrate 1 according to one embodiment of the present disclosure. In one embodiment, in the display apparatus, the pixel defining layer 30 is laid on the base substrate 10. A plurality of pixel grids 20 is defined by the pixel defining layer 30. The pixel defining layer 30 further comprises a plurality of thickness thinning regions 312. When the encapsulating layer 40 is filled into the array substrate 1, the thickness thinning regions 312 can guide the flow direction of the fillers for the encapsulating layer 40, so that the fillers for the encapsulating layer 40 can be more uniformly filled, thereby preventing fillers for the encapsulating layer 40 from being filled excessively or not fully, which causes poor performance of the display panel.

The array substrate 1 is described in detail below with reference to FIGS. 1-4 according to one embodiment of the present disclosure.

As shown in FIGS. 1-4, the array substrate 1 comprises a base substrate 10 and a pixel defining layer 30.

In one embodiment, as shown in FIGS. 1-4, the base substrate 10 may be a rectangular flat plate. The pixel defining layer 30 can be formed by masking and polishing. The pixel defining layer 30 may include a plurality of first spacing parts 310 and a plurality of second spacing parts 320. The first spacing part 310 may be in a strip shape. The plurality of the first spacing parts 310 may be arranged in parallel along the length direction of the base substrate 10 at equal intervals. The length extension direction of any of the first spacing parts 310 may be consistent with the width direction of the base substrate 10, so that a plurality of strip-shaped thickness thinning regions 312 can be defined on the base substrate 10. The surface of the free end of the first spacing part 310 may be an arc-shaped surface. The arc-shaped surface protrudes in a direction away from the base substrate 10. The shape of a cross section of the first spacing part 310 cut at any position along the width direction of the base substrate 10 is the same.

As shown in FIGS. 1-4, the plurality of the second spacing parts 320 may be in a strip shape. The length extension direction of the second spacing parts 320 may be perpendicular to the length extension direction of the thickness thinning regions 312. The plurality of the second spacing parts 320 may be distributed at equal intervals in the thickness thinning regions 312. The surfaces of the free ends of the second spacing parts 320 may be arc-shaped surfaces or planes. A plurality of pixel grids 20 may be arranged in the thickness thinning regions 312 and located in intervals between any two second spacing parts 320. The pixel grids 20 may be rectangular. The pixel grid 20 has two pairs of opposite sides. One pair of opposite sides may be respectively in contact with two adjacent first spacing parts 310, and the other pair of opposite sides may be respectively in contact with two adjacent second spacing parts 320.

The thickness of the area where the pixel grids 20 are located is smaller than the thickness of the area where the second spacing parts 320 are located. The thickness of the area where the second spacing parts 320 are located is smaller than the thickness of the area where the first spacing parts 310 are located. The thicknesses of the first spacing parts 310 and the thickness of the second spacing parts 320 are both greater than 2 micrometers. When the array substrate 1 is filled with fillers for an encapsulating layer 40, the fillers for the encapsulating layer 40 can flow along a plurality of the long strip-shaped thickness thinning regions 312. After the thickness thinning regions 312 are fully filled, fillers for the encapsulating layer 40 can flow to the first spacing parts 310 along the arc surfaces formed by the first spacing parts 310.

The array substrate 1 is provided according to one embodiment of the present disclosure. In this embodiment, a pixel defining layer 30 is laid on the base substrate 10. A plurality of pixel grids 20 is defined by the pixel defining layer 30. The pixel defining layer 30 further comprises a plurality of thickness thinning regions 312. When fillers for the encapsulating layer 40 are filled into the array substrate 1, the thickness thinning regions 312 can guide the flow direction of the fillers for the encapsulating layer 40, so that fillers for the encapsulating layer 40 can be more uniformly filled, thereby preventing the encapsulating layer 40 from being excessively filled or not fully filled, which will cause poor performance of components on the array substrate such as an OLED or other devices.

In some embodiments, as shown in FIGS. 1-4, an array substrate includes a base substrate 10, and a pixel defining layer 30 on the base substrate 10. The pixel defining layer 30 comprises a plurality of first regions 312, and the first regions 312 are at least partially separated from each other. The first regions 312 have a smaller height than other areas of the pixel defining layer 30 on the base substrate 10. The pixel defining layer 30 further comprises a plurality of first spacing parts 310. A plurality of second spacing parts 320 intersecting the plurality of the first spacing parts 310, each of the plurality of the second spacing parts 320 comprising a plurality of second spacing sub-parts 321. A height of each of the plurality of the second spacing sub-parts 321 is smaller than that of each of the plurality of the first spacing parts 310, and each of the first regions 312 comprises a plurality of the second spacing sub-parts 321 between two adjacent first spacing parts 310. When the encapsulating layer 40 is filled into the array substrate 1, the first regions 312 can guide the flow direction of the fillers for the encapsulating layer 40, so that the fillers for the encapsulating layer 40 can be more uniformly filled, thereby preventing fillers for the encapsulating layer 40 from being filled excessively or not fully, which causes poor performance of the display panel.

In some embodiments, as shown in FIG. 3, at least some of the first spacing parts 310 have different maximum widths in a plane parallel to the base substrate 10.

In some embodiments, as shown in FIGS. 2 and 3, the array substrate includes a first spacing part 310, the first spacing part 310 has a strip shape, a center region of the first spacing part is higher than two sides of the first spacing part 310 in a cross-sectional view of the first spacing part, and the cross-sectional view is perpendicular to the base substrate 10.

In some embodiments, as shown in FIG. 2, a height of the first spacing part 310 gradually decreases from the center region to the two sides in the cross-sectional view of the first spacing part 310, and the cross-sectional view is perpendicular to the base substrate.

In some embodiments, as shown in FIG. 3, a length of at least one second spacing part 320 between two adjacent first spacing parts 310 is greater than a width of at least one first spacing part 310 along a second direction, an extension direction of the first spacing parts 310 is the first direction, and a direction perpendicular to the first direction is the second direction.

In some embodiments, as shown in FIG. 3, a width of at least one second spacing parts 320 along a first direction is greater than a width of at least one first spacing parts 310 along a second direction, an extension direction of the first spacing parts 310 is the first direction, and a direction perpendicular to the first direction is the second direction.

In some embodiments, as shown in FIGS. 2 and 3, two adjacent second spacing parts 320 along a second direction is separated by a first spacing part 310, an extension direction of the first spacing parts 310 is a first direction, and a direction perpendicular to the first direction is the second direction.

In some embodiments, as shown in FIGS. 2 and 3, the pixel defining layer 10 defines a plurality of pixel grids 20 arranged in an array, there is a first spacing part 310 between two adjacent pixel grids 20, the at least two adjacent pixel grids 20 are respectively in direct contact with the first spacing part 310, and there is a second spacing part 320 between two pixel grids 20.

In the description of the specification, references made to the term "one embodiment," "some embodiments," and "exemplary embodiments," "example," and "specific example," or "some examples" and the like are intended to refer that specific features and structures, materials or characteristics described in connection with the embodiment or example that are included in at least one embodiment or example of the present disclosure. The schematic expression of the terms does not necessarily refer to the same embodiment or example. Moreover, the specific features, structures, materials or characteristics described may be included in any suitable manner in any one or more embodiments or examples.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An array substrate comprising:
   a base substrate; and
   a pixel defining layer on the base substrate;
   wherein the pixel defining layer comprises a plurality of first regions, and the plurality of first regions are at least partially separated from each other;
   the plurality of first regions have a smaller height than other areas of the pixel defining layer on the base substrate; and
   wherein the pixel defining layer further comprises:
   a plurality of first spacing parts;
   a plurality of second spacing parts intersecting the plurality of the first spacing parts, each of the plurality of the second spacing parts comprising a plurality of second spacing sub-parts;
   wherein a height of each of the plurality of the second spacing sub-parts is smaller than that of each of the plurality of the first spacing parts, and each of the plurality of first regions comprises a plurality of the second spacing sub-parts between two adjacent first spacing parts; and
   the array substrate includes a first spacing part, the first spacing part has a strip shape, a center region of the first spacing part is higher than two sides of the first spacing part in a cross-sectional view of the first spacing part, and the cross-sectional view is perpendicular to the base substrate.

2. The array substrate according to claim 1, wherein at least some of the first spacing parts have different maximum widths in a plane parallel to the base substrate.

3. The array substrate according to claim 1, wherein a height of the first spacing part gradually decreases from the center region to the two sides in the cross-sectional view of the first spacing part, and the cross-sectional view is perpendicular to the base substrate.

4. The array substrate according to claim 1, wherein a length of at least one second spacing parts between two adjacent first spacing parts is greater than a width of at least one first spacing parts along a second direction, an extension direction of the first spacing parts is the first direction, and a direction perpendicular to the first direction is the second direction.

5. The array substrate according to claim 1, wherein a width of at least one second spacing parts along a first direction is greater than a width of at least one first spacing parts along a second direction, an extension direction of the first spacing parts is the first direction, and a direction perpendicular to the first direction is the second direction.

6. The array substrate according to claim 1, wherein two adjacent second spacing parts along a second direction is separated by a first spacing part, an extension direction of the first spacing parts is a first direction, and a direction perpendicular to the first direction is the second direction.

7. The array substrate according to claim 1, wherein the pixel defining layer defines a plurality of pixel grids arranged in an array, there is a first spacing part between at least two adjacent pixel grids, the at least two adjacent pixel grids are respectively in direct contact with the first spacing part, and there is a second spacing part between at least two pixel grids.

8. The array substrate according to claim 1, wherein a surface of each of the plurality of the first spacing parts is an arc-shaped surface.

9. The array substrate according to claim 1, wherein a surface of each of the plurality of the first spacing parts is a flat surface.

10. The array substrate according to claim 1, wherein heights of the plurality of the second spacing sub-parts in a first region gradually decrease or increase along the first direction, a length direction of the first spacing parts is the first direction, and the plurality of the first spacing parts are distributed at intervals in a second direction.

11. The array substrate according to claim 1, wherein a distance between any two adjacent second spacing sub-parts in a first region is the same along the first direction, a length direction of the first spacing parts is the first direction, the plurality of the first spacing parts are distributed at intervals in a second direction, and the first region is one of the plurality of first regions.

12. The array substrate according to claim 1, wherein a thickness of each of the plurality of the second spacing parts is larger than or equal to 2 micrometers.

13. A display panel comprising:
the array substrate according to claim 1, and
a cover plate stacked above the array substrate,
wherein the encapsulating layer is arranged between the cover plate and the array substrate.

14. The display panel according to claim 13, wherein spacers are arranged on one side of the cover plate facing the array substrate, and orthographic projection of the spacers on the array substrate do not overlap the plurality of first regions.

15. The display panel according to claim 13, wherein the display panel is an OLED display panel.

16. A display apparatus comprising the array substrate according to claim 1.

17. An array substrate comprising:
a base substrate; and
a pixel defining layer on the base substrate;
wherein the pixel defining layer comprises a plurality of first regions, and the plurality of first regions are at least partially separated from each other;
the plurality of first regions have a smaller height than other areas of the pixel defining layer on the base substrate; and
wherein the pixel defining layer further comprises:
a plurality of first spacing parts;
a plurality of second spacing parts intersecting the plurality of the first spacing parts, each of the plurality of the second spacing parts comprising a plurality of second spacing sub-parts;
wherein a height of each of the plurality of the second spacing sub-parts is smaller than that of each of the plurality of the first spacing parts, and each of the plurality of first regions comprises a plurality of the second spacing sub-parts between two adjacent first spacing parts; and
a distance between any two adjacent second spacing sub-parts in a first region gradually increases along the first direction or gradually decreases along the first direction, a length direction of the first spacing parts is the first direction, and the plurality of the first spacing parts are distributed at intervals in a second direction.

* * * * *